United States Patent
Weill et al.

[11] Patent Number: 6,055,045
[45] Date of Patent: Apr. 25, 2000

[54] METHOD FOR CHARACTERIZING A PHOTOREPEATER

[75] Inventors: André Weill, Meylan; Sandrine Andre, Goncelin, both of France

[73] Assignee: SGS-Thomson Microelectronics S.A., Gentilly, France

[21] Appl. No.: 08/960,020

[22] Filed: Oct. 29, 1997

[30] Foreign Application Priority Data

Oct. 30, 1996 [FR] France .................................. 96 13478

[51] Int. Cl.$^7$ .................................................. G01B 9/00
[52] U.S. Cl. ........................................... 356/124; 356/372
[58] Field of Search .................................. 356/124, 372; 430/30; 350/124, 372

[56] References Cited

U.S. PATENT DOCUMENTS

| | | | |
|---|---|---|---|
| 4,475,811 | 10/1984 | Brunner | 355/133 |
| 4,759,626 | 7/1988 | Kroko | 356/124 |
| 5,362,585 | 11/1994 | Adams | 430/30 |
| 5,434,026 | 7/1995 | Takatsu et al. | 430/30 |
| 5,615,006 | 3/1997 | Hirukawa | 256/124 |

OTHER PUBLICATIONS

Motorola Technical Developments, Oct. 1987, USA, vol. 7, pp 31–32, Stallard B.R., et al., "Exposure and Focus Scales For Optical Lithography".

*Primary Examiner*—Richard A. Rosenberger
*Attorney, Agent, or Firm*—Wolf, Greenfield & Sacks, P.C.; James H. Morris; Theodore E. Galanthay

[57] ABSTRACT

The present invention relates to a method for characterizing at least one photorepeater and a same set of patterns implemented on several regions of a wafer, including the steps of making a standard reticle defining at least one first series of at least three identical reference patterns, which are not aligned; successively exposing several regions of a standard wafer by varying the illumination dose from one region to another; measuring the respective dimensions of the reference patterns reproduced on the different regions of the wafer to determine, for each illumination does, the mean dimension of the reference patterns; and performing a linear interpolation of these mean dimensions.

8 Claims, 1 Drawing Sheet

METHOD FOR CHARACTERIZING A PHOTOREPEATER

BACKGROUND OF THE INVENTION

1. Field of the Invention

The present invention relates to the field of photorepeaters used, in the fabrication of semiconductor circuits, to expose several regions of an integrated circuit fabrication wafer according to a determined set of patterns. The present invention applies, more specifically, to a method for characterizing a photorepeater.

2. Discussion of the Related Art

FIGS. 1 very schematically illustrates, in cross-section, the operating principle of a photorepeater.

A photorepeater is essentially formed of a light source 1 for successively exposing regions 2, 2', and 2" corresponding to chips of integrated circuits to be made on a substrate 3, for example a silicon wafer. For example, the photorepeater is used to define patterns of an etching or deposition mask, implemented in a resist layer 4 previously deposited on substrate 3. The patterns to be reproduced on each chip 2, 2', and 2" are defined by a reticle 5 implemented based on the data of conception of the integrated circuit. Focusing lenses 6 and 7 are respectively placed between light source 1 and reticle 5 and between reticle 5 and the region of substrate 3 to be insulated. The different regions of substrate 3 to be insulated are successively placed directly below light source 1. In FIG. 1, the movement of a silicon wafer has been symbolized by an arrow F, region 2' being illuminated, while region 2" has already been exposing and region 2 is waiting. The patterns, symbolized by holes 8 in reticle 5, are reduced by lens 7 to form exposing areas 9.

A problem which arises upon use of a photorepeater relates to maintaining the pattern dimensions in the final mask performed on each chip of the integrated circuit. The dimension of these patterns depends, in particular, on the sensitivity of resist 4, on the distance between the plane of the wafer and the image plane of the reticle, and on the illumination dose, that is, on the time for which a same region is exposing and on the intensity of the radiation that it receives. This problem of pattern reproducibility is even more acute in the frequent cases where several photorepeaters are used to fabricate, in large series, identical integrated circuits. In such cases, the same mask has to be reproduced on each region 2, no matter which photorepeater is used.

It is generally desired, in particular, to guarantee an identical illumination dose for each photorepeater.

It is acknowledged that by setting each photorepeater on an identical nominal illumination dose, important variations on the dimensions of the patterns reproduced by the different photorepeaters may result.

A first conventional solution to solve this lack of reproducibility consists of measuring, by means of a photosensitive cell generally associated with each photorepeater, the illumination dose for a given order so as to calibrate, individually, each photorepeater. A disadvantage of such a solution is that the photosensitive cells can themselves exhibit drifts from one photorepeater to another and thus do not guarantee that the illumination doses will be identical for all photorepeaters.

A second conventional solution consists of using a standard photosensitive cell that is displaced from one photorepeater to another to calibrate each photorepeater based on the illumination dose measured by this single sensor. Such a solution is not satisfactory because, like the former solution, it measures the general illumination of the region insulated by the photorepeater and does not take into account drifts of other parameters, in particular, the resist laying and development conditions and the optical aberrations of the lens, notably at its circumference.

A third conventional solution consists of making, with each photorepeater, a test wafer based on the reticle which is associated with the photorepeater and which defines the patterns of the integrated circuit to be fabricated. The illumination dose is varied from one region of the plate to another. Then, the dimensions of a reference pattern, generally provided at the edge of the reticle (outside the patterns defining the integrated circuit) are measured. The dimension of the reference pattern generally corresponds to the critical pattern (the smallest) of the mask to be implemented, for example, 0.35 $\mu$m, 0.5 $\mu$m, or 0.7 $\mu$m. Then, based on these measurements, the illumination dose to be applied at the series production is set. A disadvantage of such a solution is that the reference pattern generally is placed at the edge of the pattern to be reproduced, that is, where there are the most optical aberrations. Another disadvantage of this solution is that it has to be repeated for each new fabrication series.

As for the previous solutions, the implementation of such a solution results, in practice, in dimensional drifts of about 20% from one photorepeater to another.

The difficulties encountered to guarantee the reproducibility of a same pattern even though several different photorepeaters are used generally compel the use of a single photorepeater per integrated circuit production series, which reduces the output of a production line.

Further, even by using a single photorepeater, conventional solutions, for measuring the illumination doses or checking the dimensions by means of a reference pattern on the chips, do not avoid significant dimensional drifts of the reproductions, on the same chip, of the same patterns appearing several times on the same reticle.

SUMMARY OF THE INVENTION

The present invention aims at providing a method for characterizing a photorepeater which enables reducing or minimizing the difference between a desired dimension and the mean dimension of identical patterns on a same chip.

The present invention also aims at providing a method for characterizing photorepeaters which guarantees a good reproducibility of a the same pattern, from one photorepeater to another.

To achieve these and other objects, the present invention provides a method for characterizing at least one photorepeater and a same set of patterns implemented on several regions of a wafer, including the steps of making a standard reticle defining at least one first series of at least three identical reference patterns, which are not aligned; successively exposing several regions of a standard wafer by varying the illumination dose from one region to another; measuring the respective dimensions of the reference patterns reproduced on the different regions of the wafer to determine, for each illumination dose, the mean dimension of the reference patterns; and performing a linear interpolation of these mean dimensions.

According to an embodiment of the present invention, the series of reference patterns of the standard reticle includes five patterns distributed at the four corners and at the center of the reticle surface.

According to an embodiment of the present invention, a same standard reticle is used to characterize several photorepeaters.

According to an embodiment of the present invention, the dimension of the reference patterns of the standard reticle corresponds to the nominal resolution of the photorepeater.

According to an embodiment of the present invention, the standard reticle includes several different series of reference patterns.

According to an embodiment of the present invention, the series differ by the shape of the reference patterns.

According to an embodiment of the present invention, the number of exposed regions of the standard wafer is chosen according to the desired accuracy for the linear interpolation.

These objects, characteristics and advantages as well as others, of the present invention, will be discussed in detail in the following non-limiting description of specific embodiments of the present invention, in relation with the accompanying drawings.

DETAILED DESCRIPTION

A characteristic of the present invention is to use a single standard reticle, defining at least one series of reference patterns of same dimensions distributed across the entire exposition field, dedicated to characterizing one or several repeaters. This same reticle is, according to the present invention, used in the photorepeater(s) of a same production unit, to obtain, for each photorepeater, a standard wafer reproducing the series of patterns in several regions exposed with different illumination doses.

Figure 1:
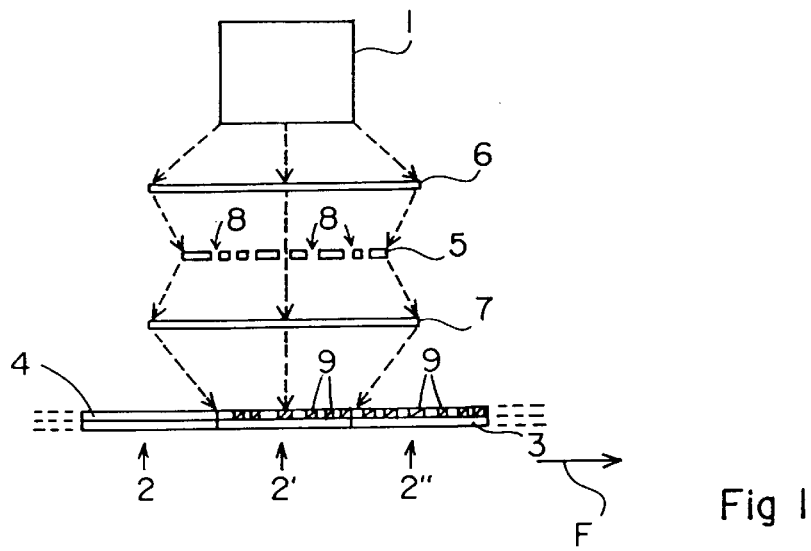
FIG. 1, previously described, is meant to show the state of the art and the problem to solve.

According to the present invention, a standard reticle defining at least one series of individual patterns of same dimensions is first made. The patterns in a same series are distributed on the reticle surface, so that at least three of these patterns are not aligned, to avoid that all patterns are distributed on a diameter of the reductive lens (7, FIG. 1) of the photorepeater. Preferably, at least five patterns distributed, for example, at the center and at the four corners of the reticle, are provided.

Figure 2:
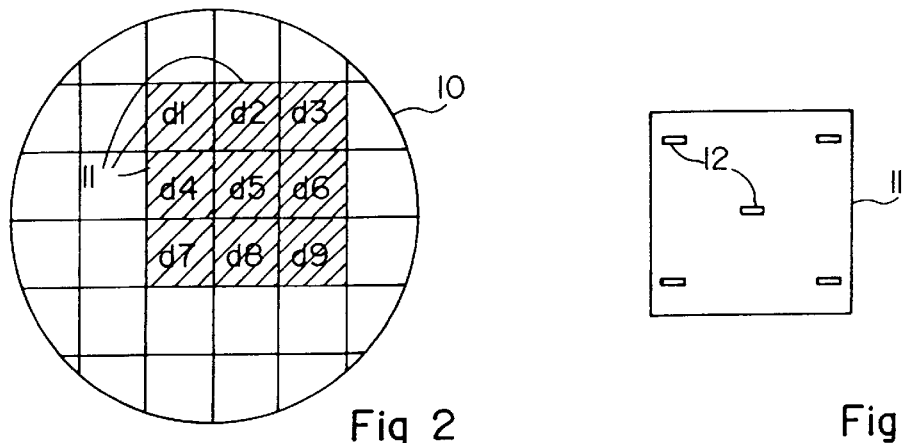
FIG. 2 schematically shows, in top view, a calibration wafer illustrating an embodiment of the present invention.

The reticle is then placed successively in each photorepeater, to insulate several regions of a standard wafer, previously covered with a resist layer and placed in the considered photorepeater, by varying the illumination dose from one area to another. For each photorepeater, a wafer 10 such as shown in FIG. 2 on which, in this example, nine regions 11 of the wafer have been exposed with different, for example increasing, doses, respectively d1 to d9, is then obtained. It should be noted that all regions of the standard wafer do not need to be exposed, the number of exposed regions being, for example, included between 5 and 50.

Figure 3:
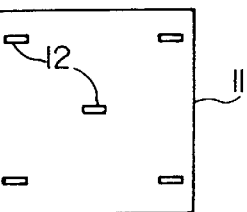
FIG. 3 shows, in an enlarged view, a region of the wafer shown in FIG. 2, illustrating respective positions of reference patterns according to an embodiment of the present invention.

Then, the exposed resist layer is developed and, for each region 11, a reproduction 12 of the patterns of the standard reticle is obtained, as illustrated in FIG. 3 for a series of five reference patterns.

Figure 4:
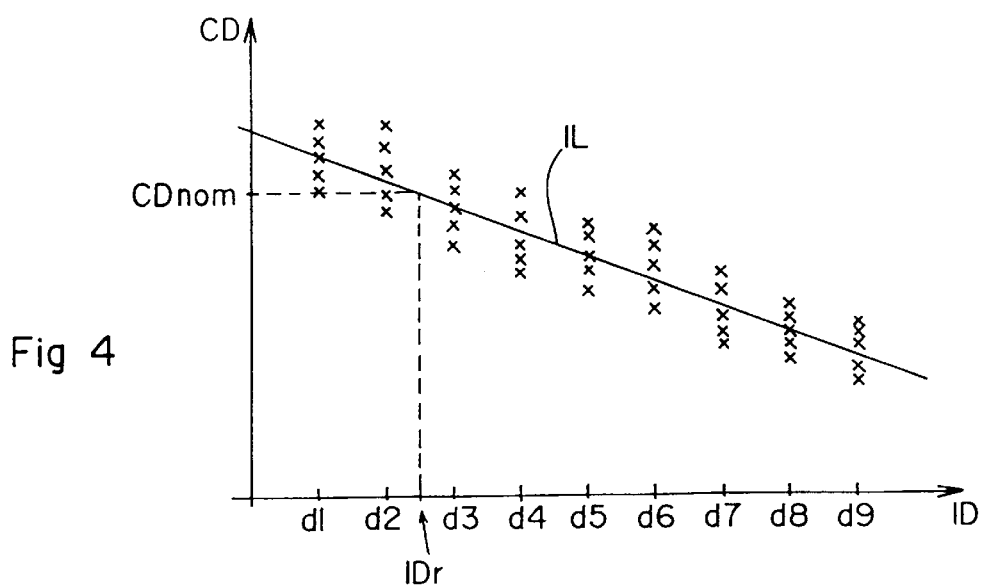
FIG. 4 shows an example of dimensional variations of measurements on the wafer shown in FIG. 2.

After the development of wafer 10, the respective dimensions of the patterns 12 obtained in each insulated region are measured, and the actual dimension CD of each reference pattern according to the dose ID of the region considered is reported on a diagram (FIG. 4). In FIG. 4, the respective dimensions of the reference patterns have been symbolized with a cross in front of each illumination dose.

A linear interpolation IL of the mean dimension of the reference patterns is then performed for each dose.

Based on the nominal dimension $CD_{nom}$ of the reference pattern, that is, the dimension, assigned with the nominal reduction factor of lens 7, of the standard reticle pattern, the correction to be applied to the illumination dose for the mean dimension of the patterns actually obtained to correspond to the desired nominal dimension may be determined.

This correction to apply to the illumination dose is, according to the invention, used for calibrating a photosensitive cell associated to the photorepeater and serving to measure the illumination dose received by the wafers during the processing.

The dimension chosen for the pattern of the standard pattern depends on the nominal resolution of the photorepeater, which is essentially linked to its optical components. Although a reference pattern of a size corresponding to the critical pattern (the smallest pattern) used in production may be chosen, it will be preferred, according to the present invention, to choose a reference pattern corresponding to at least the nominal resolution of the photorepeater. Indeed, photorepeaters may be used to produce circuits in a finer technology (for example, 0.35 $\mu$m) than the nominal resolution of the photorepeater (for example, 0.40 $\mu$m). Other parameters of the fabrication process (for example, the resist, or a multiple layer system) which are likely to vary from one fabrication series to another are then modified. It is thus preferable to keep to one reference pattern corresponding to at least the nominal critical pattern of the photorepeater so that the characteristic of the photorepeater may be used for several fabrication series.

The number of regions exposed on the standard wafer (and thus, the number of illumination doses) depends on the desired accuracy for the linear interpolation.

Thus, a series of diagrams characteristic of the photorepeaters are obtained. Based on these diagrams, it can be determined, by knowing the nominal dimension $CD_{nom}$ of the critical pattern to be obtained for a given fabrication, the illumination dose IDr to be assigned to each photorepeater so that the patterns reproduced by each repeater all have substantially the same dimension Preferably, knowing the illumination dose IDr, the photosensitive cell is calibrated so that it takes into account the correction to apply. It will be noted that this correction may vary greatly from one photorepeater to another but remains, for a given photorepeater, substantially independent of the illumination dose. As a consequence, once the correction for the nominal dimensions is determined, the corrections for other dimensions follow the same ratio between illumination doses.

An advantage of the present invention is that it allows for choosing the illumination dose which is best adapted to maintain the pattern dimensions.

Another advantage of the present invention is that it takes into account possible dimensional drifts, on a same chip, due to optical aberrations of the reductive lens.

An advantage of the present invention is that it allows compensation of slight drifts of other parameters from one photorepeater to another, for example, differences in time or in resist baking temperatures or differences in the optical characteristics of the photorepeaters. Indeed, it is acknowledged, after having set the respective illumination doses of the photorepeaters based on their respective diagrams and for a same nominal dimension, that the actual illumination dose (measured by means of a standard sensor moved from one photorepeater to another) varies from one photorepeater to another. This effective illumination difference shows that the illumination dose compensates other technological drifts.

It is now possible, by means of a procedure for characterizing several photorepeaters meant to reproduce sets of patterns of a same series of integrated circuits to be fabricated, to guarantee a good pattern reproducibility from one photorepeater to another. It is not necessary to perform this characterization process for each series of wafers to be processed. The method according to the present invention can however be implemented, periodically, to correct possible time drifts of the parameters of the photorepeater.

By implementing the present invention, the acknowledged dimensional variations are limited to about 3 to 5%.

As an alternative, two different series of identical reference patterns can be provided in the standard reticle. For example, it can be desired to characterize the photorepeater (s) based on critical patterns having different shapes (for example, linear and round). In this case, one item of each reference pattern is distributed on the surface of the standard reticle as previously described. Two interpolation lines, respectively associated with the two series of patterns, are then obtained. Such an alternative enables, during a series fabrication, adaptation of the dose according to the type of mask patterns to be made. If the two shapes are present in the set of patterns to be reproduced on a fabrication batch (for example, a grid and pellets), a mean correction of the illumination dose between the two corrections, respectively supplied by the two interpolations for the nominal dimensions associated with each shape of pattern may be chosen, in case of need.

Of course, the present invention is likely to have various alterations, modifications, and improvements which will readily occur to those skilled in the art. In particular, although reference has been made in the foregoing description to photorepeaters meant for the fabrication of integrated circuits, the present invention applies to any optical pattern reproduction device. Further, it should be noted that the exploitation of the measurements performed on the standard wafers, which has been described according to a manual mode for reasons of clarity, may also be performed automatically by computer means.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for characterizing at least one photorepeater and at least one series of reference patterns reproduced on several regions of a standard wafer, the method comprising steps of:

making a standard reticle defining a first series of at least three identical reference patterns, which are not aligned;

successively exposing, through the standard reticle, the several regions of the standard wafer to a light source of the at least one photorepeater by varying an illumination dose from one region to another;

developing the standard wafer to reproduce the first series of reference patterns on the standard wafer in the several exposed regions;

measuring, for each exposed region of the several exposed regions, a developed dimension of each reference pattern of the first series;

determining, for each illumination dose, a mean dimension of the reference patterns in each exposed region based on the developed dimensions; and performing a linear interpolation of the mean dimensions.

2. A method according to claim 1, including step of:

calibrating a photosensitive cell of the photorepeater based on a difference between a linearly interpolated mean dimension of the reference patterns corresponding to a particular illumination dose and a desired nominal dimension for the particular illumination dose.

3. A method according to claim 1, wherein:

the at least one photorepeater includes a plurality of photorepeaters, each photorepeater having a respective light source;

the standard reticle is used to characterize each photorepeater of the plurality of photorepeaters; and the steps of successively exposing, developing, measuring, determining and interpolating are achieved for each photorepeater with a respective standard wafer associated thereto.

4. A method according to claim 1, wherein a pattern dimension of the reference patterns of the standard reticle corresponds to a nominal resolution of the at least one photorepeater.

5. A method according to claim 1, wherein the first series of reference patterns of the standard reticle includes five patterns distributed at four corners and at a center of the standard reticle.

6. A method according to claim 1, wherein the standard reticle includes several different series of reference patterns.

7. A method according to claim 6, wherein the series differ by the shape of the reference patterns.

8. A method according to claim 1, wherein a number of the several regions of the standard wafer is chosen according to a desired accuracy for the linear interpolation.

* * * * *

UNITED STATES PATENT AND TRADEMARK OFFICE
CERTIFICATE OF CORRECTION

PATENT NO. : 6,055,045
DATED : April 25, 2000
INVENTOR(S) : André Weill and Sandrine Andre It is certified that error appears in the above-identified patent and that said Letters Patent is hereby corrected as shown below:

Column 1, line 31 should read:
   while region 2" has already been exposed and region 2 is

Column 1, line 33 should read:
   reduced by lens 7 to form exposed areas 9.

Column 1, line 41 should read:
   region is exposed and on the intensity of the radiation that

Column 3, line 36 should read as follows:
   exposure field dedicated to characterizing one or several

Signed and Sealed this

Twentieth Day of March, 2001

Attest:

NICHOLAS P. GODICI

*Attesting Officer*     Acting Director of the United States Patent and Trademark Office